United States Patent [19]

Little et al.

[11] Patent Number: 5,098,483
[45] Date of Patent: Mar. 24, 1992

[54] METHODS OF TREATING SPHERICAL SURFACES

[75] Inventors: Roger G. Little; Piran Sioshansi, both of Bedford; Richard W. Oliver, Acton, all of Mass.

[73] Assignee: Spire Corporation, Bedford, Mass.

[21] Appl. No.: 403,293

[22] Filed: Sep. 5, 1989

[51] Int. Cl.$^5$ ............................................. C23C 11/10
[52] U.S. Cl. ............................................. 148/4
[58] Field of Search ............................................. 148/4

[56] References Cited

U.S. PATENT DOCUMENTS 4,872,922 10/1989 Bunker ............................................. 148/4

Primary Examiner—Peter D. Rosenberg
Attorney, Agent, or Firm—Morse, Altman, Dacey & Benson

[57] ABSTRACT

Improved methods for the treatment of spherical surfaces designed to improve their physical and chemical properties are disclosed. The methods include the provision of a fixture by which a plurality of spherical workpieces are presented to a treatment source in a way that their entire respective spherical surfaces are uniformly treated and to a uniform predetermined depth. The fixture is mounted for motion about two axes normal to each other. The methods include randomization of the motion about one of the two axes of motion by interrupting one of the two motions for a predetermined period of time. The treatment sources include: pulsed electron beam and light sources, plasma sources, reaction chambers for CVD or MOCVD, sputtering, sputter enhanced ion implantation sources and physical vapor deposition in conjunction with an ion beam source.

21 Claims, 6 Drawing Sheets

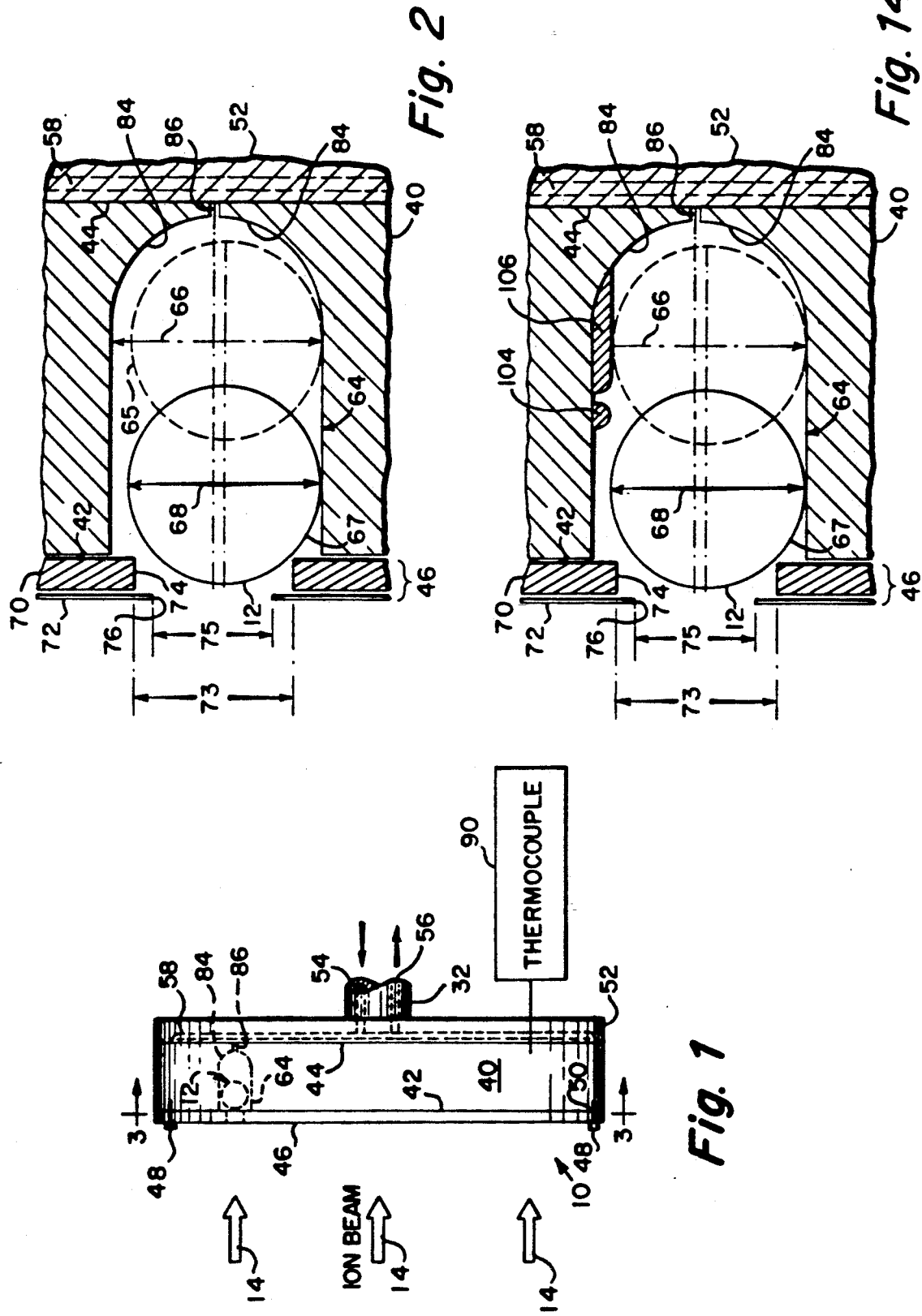

METHODS OF TREATING SPHERICAL SURFACES

BACKGROUND OF THE INVENTION

1. Field of the Invention

The present invention relates generally to spherical surfaces and, more particularly, to improved methods for the treatment of spherical surfaces for the purpose of improving their physical and chemical properties. In copending applications of Stephen N. Bunker et al, Ser. No. 167,632, filed Mar. 11, 1988, Group 111, and of Richard W. Oliver, Ser. No. 383,927, filed Jul. 21, 1989, also Group 111, both assigned to a common assignee, Spire Corporation, such improvements in the physical and chemical properties of spherical surfaces are effected by ion implantation.

2. The Prior Art

Ion implantation is a well known method for the surface treatment of metals and compounds, see *Treatise on Materials Science and Technology*, Vol. 18, "Ion Implantation," 1980, Academic Press, Inc. See also a recently issued U.S. Pat. No. 4,693,760, assigned to the common assignee herein, the Spire Corporation, and entitled "Ion Implantation of Titanium Workpieces Without Surface Discoloration." See further an article authored by M. S. Dresselhaus et al of M.I.T. "Ion Implantation of Polymers," *Mat. Res. Soc. Symp. Proc.*, Vol. 27 (1984), pp. 413-422, and another by G. K. Wolf, "Ion Bombardment Chemistry," *Nucl. Instrum. Meth- ods* 139 (1976) 147. See also "Ion Beam Modification of Materials for Industry," *Thin Solid Films*, 118 (1984) 61-71; "The Wear Behavior or Nitrogen-Implanted Metals," *Metallurgical Transactions*, A 15 (1984), 2221-2229; and "Wear improvement of surgical titanium alloys by ion implantation;" *J. Vac. Sci. Tech.* A3 (6) Nov./Dec. 1985, 2670-2674.

Inasmuch ion implantation is a line-of-sight process, spherical surfaces represent a geometry that is particularly difficult to ion implant, especially ion implant uniformly about its spherical surface. The uniform ion implantation of spherical surfaces, in particular when needing to process large quantities thereof, has thus presented special problems. The problem has been aggravated even more when wanting to ion implant spherical surfaces of different sizes and of different materials. These shortcomings have been addressed with some success in said copending applications Ser. No. 167,632, filed Mar. 11, 1988, Group 111, of Stephen N. Bunker et al, and of Richard W. Oliver, Ser. No. 383,921, filed Jul. 21, 1989 and assigned to the common assignee, Spire Corporation of Bedford, Mass., the disclosures of both of which are incorporated herein by reference. There is, however, still plenty of room for improvements.

For instance, in addition to exposing the spherical surfaces to an ion beam, the subject, inter alia, of the two aforementioned copending applications, the spherical surfaces also can be surface treated by being exposed to other treatment sources. Some of these treatment sources include sputtering, plasma and pulsed electron beam and light sources, CVD and MOCVD reaction chambers, physical vapor depositions in conjunction with ion beam sources and sputter enhanced ion implantation sources.

SUMMARY OF THE INVENTION

It is a principal object of the present invention to overcome the above disadvantages by providing improved processes for the large scale uniform treatment of spherical surfaces of different sizes and materials.

More specifically, it is an object of the present invention to provide processes, other than by ion implantation, for the large scale surface treatment of spherical workpieces, of whatever sizes and materials, with substantially uniform doses and to substantially uniform depths throughout their respective spherical surfaces. The processes include the provision of a fixture with which a plurality of spherical workpieces are presented, with randomization, in a suitable work station of a treatment source to surface treatment in a way that their entire respective spherical surfaces are uniformly treated to improve their physical and chemical surface characteristics. The fixture is mounted for motion about two axes normal to one another. The treatment sources include: pulsed electron beam and light sources, plasma sources, reaction chambers for CVD or MOCVD, sputtering, sputter enhanced ion implantation sources and physical vapor deposition in conjunction with an ion beam source. The fixture comprises a member, one of the two axes of motion being concentric with the axis of the member and the motion thereabout being rotational, the other of the two axes being normal or at an angle thereto and the motion thereabout being a rocking type of motion, a plurality of holes formed in one side of the member and designed to accommodate loosely therein the plurality of spherical workpieces, each of the plurality of holes is formed with a spherical bottom and provided with a cleaning orifice communicating with the second side of the member, means mounted on the member to continuously monitor its temperature, and a cover plate removably secured on the first side of the member and provided with a plurality of spherical workpieces are presented, with randomization, in a suitable work station of a treatment source to surface treatment in a way that their entire respective spherical surfaces are uniformly treated to improve their physical and chemical surface characteristics. The fixture is mounted for motion about two axes normal to one another. The treatment sources include: pulse electron beam and light sources, plasma sources, reaction chambers for CVD or MOCVD, sputtering, sputter enhanced ion implantation sources and physical vapor deposition in conjunction with an ion beam source. The fixture comprises a member, one of the two axes of motion being concentric with the axis of the member and the motion thereabout being rotational, the other of the two axes being normal thereto and the motion thereabout being a rocking type of motion, a plurality of holes formed in one side of the member and designed to accommodate loosely therein the plurality of spherical workpieces, each of the plurality of holes is formed with a spherical bottom and provided with a cleaning orifice communicating with the second side of the member, means mounted on the member to continuously monitor its temperature, and a cover plate removably secured on the first side of the member and provided with a plurality of apertures concentric with the plurality of holes formed in the member. Preferably, both the fixture and the spherical workpieces are degaussed to remove any potential magnetization. Preferably, the randomization is effected every 90 to 120 seconds by interrupting the rocking motion for about 15 to about 30 seconds. Preferably, the rotational motion is about one rpm.

Other objects of the present invention will in part be obvious and will in part appear hereinafter.

The invention accordingly comprises the processes of the present disclosure, its components, parts and their interrelationships, the scope of which will be indicated in the appended claims.

BRIEF DESCRIPTION OF THE DRAWINGS

For fuller understanding of the nature and objects of the present invention, reference is to be made to the following detailed description, which is to be taken in connection with the accompanying drawings, wherein:

FIG. 1 is a schematic side view of a fixture designed to present a plurality of spherical workpieces to a treatment source according to the invention;

FIG. 2 is a fragmentary section, on an enlarged scale, of a portion of the fixture illustrated in FIG. 1;

FIG. 14 is a view similar to FIG. 2 but illustrating a further feature of the invention.

DETAILED DESCRIPTION OF THE PREFERRED EMBODIMENTS

Figure 3:
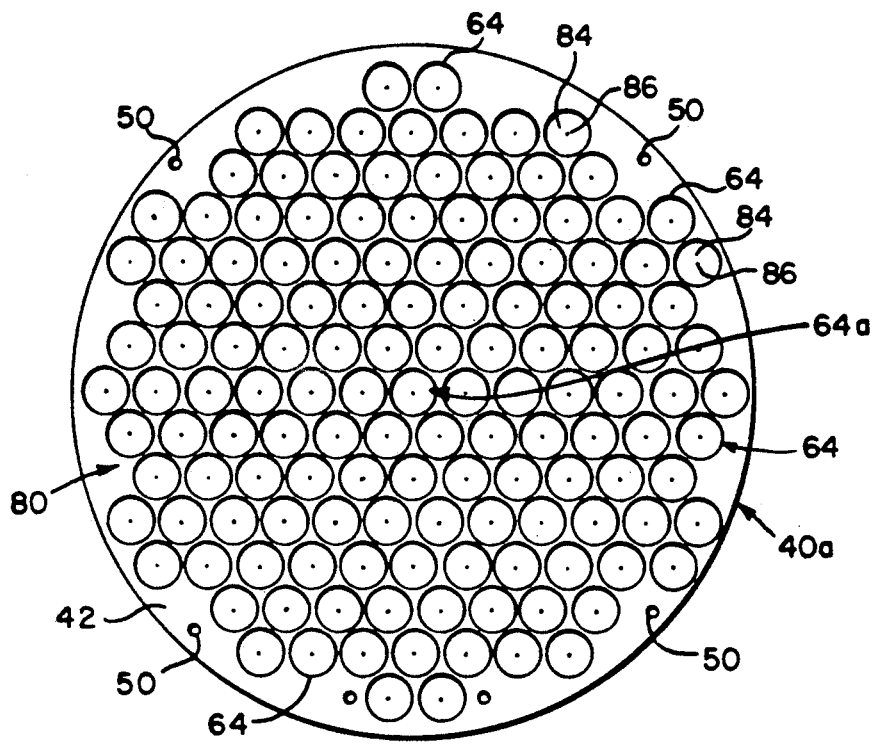
FIG. 3 is a plan view along the line 3—3 and on an enlarged scale, of the fixture illustrated in FIG. 1.

In general, the present invention pertains to improved processes for the treatment of spherical surfaces so as to enhance their surface characteristics.

In copending applications of Stephen N. Bunker et al, Ser. No. 167,632, filed Mar. 11, 1988, Group 111, and of Richard W. Oliver, Ser. No. 383,927, filed Jul. 21, 1989, also Group 111, both assigned to a common assignee, Spire Corporation, such improvements in the physical and chemical properties of spherical surfaces are effected by ion implantion. The disclosures of both of said applications Ser. Nos. 167,632 and 383,927 have been incorporated herein by reference. As known, ion implantation is a line-of-sight process. Consequently, spherical surfaces define a geometry that is particularly difficult to ion implant. This is specially so when it is required that the spherical surfaces be ion implanted uniformly with substantially the same dose and to substantially the same depth about their entire spherical surfaces. Such requirements prevail in instances when the spherical workpieces are intended for use as ball bearings designed for exotic applications, as for instance in space or armaments including aircraft and ships. These specialized applications require ball bearings of all sizes and widely varied materials, including some of miniature sizes. The large scale uniform ion implantation of spherical workpieces of differing diameters and materials has been addressed with some success in said copending applications Ser. No. 167,632, and 387,927 and assigned to a common assignee, the Spire Corporation.

As mentioned, the object of the present invention is to provide processes, other than by ion implantation, for the large scale surface treatment of spherical workpieces, of whatever sizes and materials, with substantially uniform doses and to substantially uniform depths throughout their respective spherical surfaces. The processes include the provision of a fixture with which a plurality of spherical workpieces are presented, with randomization, in a suitable work station of a treatment source to surface treatment in a way that their entire respective spherical surfaces are uniformly treated to improve their physical and chemical surface characteristics. The fixture is mounted for motion about two axes normal or at an angle to one another. The treatment sources include: pulsed electron beam and light sources, plasma sources, reaction chambers for CVD or MOCVD, sputtering, sputter enhanced ion implantation sources and physical vapor deposition in conjunction with an ion beam source.

The processes of the invention essentially include the steps of providing a fixture 10 designed to accommodate and present a plurality of spherical workpieces 12 to a treatment source 14, providing a plurality of spherical workpieces 12 and placing the workpieces 12 into the fixture 10, and exposing the plurality of spherical workpieces 12 to the treatment source 14 for a predetermined period of time so as to treat each one of the plurality of spherical workpieces 12 over their respective entire spherical surfaces with substantially uniform doses and to substantially uniform depths, while simultaneously assuring that the spherical workpieces 12 themselves do not overheat. See FIGS. 1 and 4. Such unwanted overheating of the spherical workpieces 12 would adversely affect their surface characteristics and could, if the overheating were excessive, actually defeat the very purpose of the inventive processes, i.e., to improve their surface characteristics. As known, the temperature of the spherical workpieces 12 during their treatment is affected, inter alia, by the energy of the treatment process 14, the size of the workpieces 12 and the design of the fixture 10. In order to achieve better operative control of these process variables, a thermocouple 90 is operatively connected to the fixture 10 and constantly monitors its temperature, particularly during an ion implantation run.

Desired surface characteristics for the spherical workpieces 12 include, among others, enhanced surface hardness and enhanced resistance to chemical attack. The desired surface characteristics vary depending on the intended end use of the spherical workpieces 12 and are, of course, influenced, among others, by their sizes and/or the materials from which they were made.

Figure 4:
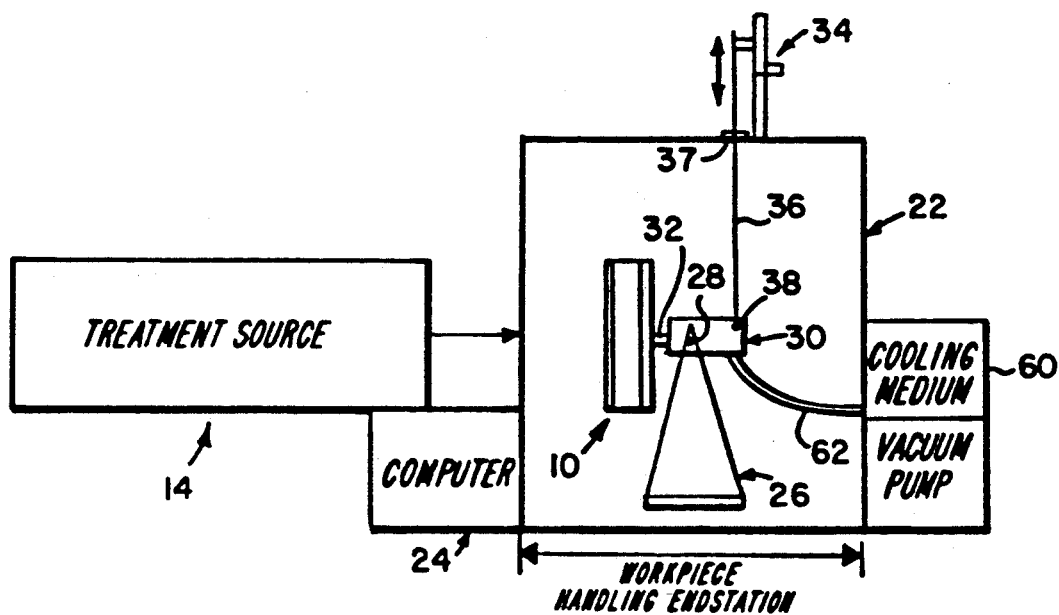
FIG. 4 is a schematic view of a treatment source and a workpiece handling endstation featuring the fixture of FIGS. 1 and 2 useful in practicing the process of the invention.

The treatment source 14 is adapted to include a workpiece handling endstation 22, which serves as the treatment chamber, and a computer 24, as may be best observed in FIG. 4. The computer 24, which is operatively coupled to the thermocouple 90, allows for flexibility in the selection and adjustment of the operating parameters of the treatment source 14, as required, and also for controlling the operation of the operative parts thereof, as monitored by the thermocouple 90.

Within the treatment chamber 22, the fixture 10 is shown mounted on a suitable base 26. The base 26 is provided with a pivot axis 28. The pivot axis 28 is designed rockingly to mount therein a first motor assembly 30 provided with a rotatable shaft 32. Shaft 32 in turn is designed to mount, for rotational displacement thereabout, the fixture 10. The rocking motion is imparted to the first motor assembly 30, and via its shaft 32 to the thereon mounted fixture 10, by a second linear motor drive assembly 34, preferably mounted outside of the implantation chamber 22. An appropriate linkage 36 is designed to transmit, through an appropriate feedthrough 37, a reciprocating linear motion from the second linear motor drive assembly 34 to an anchor 38 on the first motor assembly 30. It will be appreciated that the two axes of motion of the fixture 10 are either normal or at an angle to each other. One of the two axes is concentric with the longitudinal axis of the first motor assembly 30 as defined by its shaft 32, and the second of the two axes passes through the pivot axis 28, either normal or at an angle to the shaft 32.

The fixture 10 essentially comprises three elements, observe FIGS. 1-3: a member 40, preferably shaped as a disc and having a front surface 42 and a back surface 44; a combination cover plate and/or mask 46 removably fastened to the front surface 42 by a plurality of suitable fasteners 48 reaching into a plurality of tapped holes 50 formed in the surface 42; and a cooling plate 52 disposed on the back surface 44 and secured to the member 40. Preferably, the member 40 is secured to the cooling plate 52 by a plurality of studs (not shown) extending from the member 40 and designed to pass through a plurality of matching holes (not shown) formed in the cooling plate 52. A plurality of nuts (not shown) are mounted on the extended studs, clamping thereby the cooling plate 52 to the member 40. Alternatively, the plate 52 is being welded thereto.

Preferably, the shaft 32 is formed integrally with the cooling plate 52. Such a unitary construction is advantageous since it allows for the removal of the entire fixture 10 from within the treatment chamber 22 following the completion of the ion implanting process by simply dislodging the shaft 32 from the first motor assembly 30.

The shaft 32 is provided with an inlet channel 54 and an outlet channel 56, both communicating with a suitably shaped cooling channel 58 formed within the cooling plate 52 in parallel spaced relation to the back surface 44 of the disc-shaped member 40. The channels 54 and 56 formed in the shaft 32, in turn communicate with appropriate fixtures formed within the first motor assembly 30. Suitable cooling medium, such as deionized water, is contained in a suitable container 60 located outside the treatment chamber 22. A bilumen flexible hose 62, appropriately insulated, connects the container 60 with the fixtures formed within the first motor assembly 30 so as to allow for the continuous circulation of fresh cooling medium from the container 60 to the cooling channel 58 formed in the cooling plate 52 and back to the container 60. Preferably, both the disc-shaped member 40 and the cooling plate 52 are formed of metal. Preferred metals include stainless steel for the member 40, or a metal compatible with the material to be treated. The cooling plate 52 is preferable made from aluminum or copper for good thermal transfer.

The disc-shaped member 40 is provided with a plurality of ball holes 64 formed in its front surface 42. The size and the number of these ball holes 64 formed in the member 40 will vary, depending on the diameters of the particular spherical workpieces 12 intended for ion implantation. As may be best observed in FIG. 2, the particular diameter of the ball holes 64, as indicated by an arrow 66, exceeds the particular diameter of the particular spherical workpieces 12 being treated, as indicated by a second arrow 68. This is important so as to allow the spherical workpieces 12 (i.e., the balls) freedom to move within the ball holes 64. Such movement of the spherical workpieces 12 involves not only the free rotation of the balls about their respective axes when within the holes 64, but also, and just as importantly, the movement of the balls from a backward position 65, indicated in phantom lines, to a forward position 67, indicated in solid lines. Preferably, the depth of the ball holes 64 is about one and one-half times the diameter 68 of the particular spherical workpieces 12.

The bottoms of the ball holes 64 are formed with spherical surfaces 84 by being cut with a ball end mill. As a result, there is less likelihood of damage occurring to the spherical workpieces 12. Since the workpieces 12 are now in contact with the inside of the holes 64 at one point only, the workpieces 12 can spin more effectively, achieving thus an even more uniform implantation of their surfaces.

Care must be exercised that the inside surfaces of the ball holes 64 be machined to be as smooth as possible throughout. Since the balls being implanted are intended to move within the holes 64, any high points existing on the inside walls of the ball holes 64 could damage the balls.

It is one of the functions of the combination cover plate and/or mask 46, when secured onto the front surface 42 of the member 40, to contain the spherical workpieces 12 within their respective ball holes 64. In order to achieve this function, the combination cover plate and/or mask 46 can comprise a plate 70 by itself, in which case the plate 70 also functions as the mask. In the alternative, the combination can also include a mask 72. The need for a separate mask will be more fully evident from the description below. Both the plate 70, and the mask 72 in instances where one is used, are provided with a plurality of apertures 74 and 76, respectively. The diameters of the respective apertures 74 and 76 are indicated by arrows 73 and 75. Each of these plurality of apertures 74 and 76 is formed concentric with the plurality of holes 64 formed in the disc-shaped member 40. So as to function to contain the spherical workpieces 12 within their respective ball holes 64, both the apertures 74 and the apertures 76 must be smaller in their diameters 73 and 75 than the particular diameter of the particular spherical workpieces 12 being surface treated.

It is pointed out that the combination cover plate and/or mask 46, even in instances when it is made up of both the plate 70 and the separate mask 72, is so formed and constructed that it can be fastened onto the front surface 42 of the member 40 with either of its parallel spaced surfaces facing the surface 42. Thus, when the separate mask 72 is used, the mask 72 can be located on the outside, as illustrated in FIG. 2, or the mask 72 can be located in between the plate 70 and the front surface 42 of the member 40, depending on the particular operating conditions now being described. Further, when the separate mask 72 is used, it preferably is permanently attached to and united with the plate 70, as for instance by being welded or otherwise secured thereto. Further, when the separate mask 72 is used, its apertures 76 must have diameters 75 which are either identical with the diameters 73 of the apertures 74 or are smaller than the apertures 74. Consequently, the diameters 75 of the apertures 76 cannot exceed the diameters 73 of the apertures 74.

For most applications, the combination cover plate and/or mask 46 can comprise simply the plate 70. This is so since the second function thereof is that of a mask defining the angle of incidence of the treatment source 14 on the spherical workpieces 12. This angle of incidence of the treatment source 14 on the spherical workpieces 12 preferably is within about 45° of normal incidence in order to minimize loss of material due to sputtering.

There are instances, however, when the combination cover plate and/or mask 46 must include both the plate 70 and the mask 72, although preferably constructed and mounted as a unit, as mentioned. These instances include a situation when the material comprising the spherical workpieces 12 intended to be surface treated is not compatible with the material comprising the plate 70. Another instance involves a situation where the diameter 66 of the ball holes 64 is already very small indeed due to the miniature sizes of the spherical workpieces 12 being ion implanted. The mask 72 always is formed thin, especially when compared to the thickness of the plate 70.

In FIG. 3 is illustrated in plan view, a disc-shaped member 40a designed to surface treat small-diameter spherical workpieces 12. The ball holes 64 formed in the front surface 42 of the disc-shaped member 40 are illustrated as arranged in a hexagonal pattern 80 for maximum packing and a most efficient use of the treatment source 14. This hexagonal pattern 80 is characterized by having the central ball hole 64a surrounded by six rows of holes 64 radiating in six directions, like spokes of a wheel.

Preferably, the disc-shaped member 40, the cooling plate 52 and the cover plate 70 are formed of metal, such as stainless steel. The thin mask 72, when one is used, also is made of metal, but preferably a non-sputtering metal, such as tantalum, and the like.

In practicing the processes of the invention, it is important first to clean the fixture 10 and the spherical workpieces 12 to be surface treated of all surface contamination. The spherical workpieces 12 preferably are cleaned in suitable solvent baths, including 1,1,1-trichloroethylane and methanol. In order to facilitate the cleaning of the fixture 10, each of the ball holes 64 is further provided with a cleaning orifice 86 concentric with its new spherical bottom 84. The orifice 86 effects communication with the back surface 44 of the disc-shaped member. As a result, when the fixture 10 on its first use for the day is first cleaned, the use of mechanical abrasion with swabs, why still necessary, is no longer the only feature relied on to ensure that no debris and contaminants remain in the ball holes 64 from any prior use. The cleaning orifice 86 now permits the cleansing solvent to drain therethrough, removing any residue of debris in a simplified, less expensive manner. Then the fixture 10 is mounted empty, i.e., with no spherical workpieces 12 therein, into the workpiece handling endstation 22 and is subjected therein to bombardment by treatment source 14, preferably including argon or nitrogen.

Before any treatment run, both the fixture 10 and the spherical workpieces 12 preferably are degaussed to remove any potential magnetization therefrom. As known, degaussing, also known as deperming, is a method of neutralizing, i.e., demagnetizing, a magnetic field surrounding an item, herein the fixture 10 and the spherical workpieces 12. Degaussing of both preferably is effected with the aid of a 15 inch diameter degaussing coil, which is a plastic-encased coil that can be plugged into a conventional 120 VAC outlet and moved slowly forward and away from the fixture 10 and the spherical workpieces 12.

Immediately thereafter, the spherical workpieces 12 are loaded into their ball holes 64, the appropriate combination cover plate and/or mask 46 is secured onto the front surface 42 of the disc-shaped member 40, and the workpiece handling endstation 22 is pumped down to the desired level of vacuum. The cooling medium in container 60 is caused to flow to the fixture 10 and the first and second motor assemblies 30 and 34 are rendered operational, preferably under the control of the computer 24. The computer 24 also is designed to control all of the operational parameters of the treatment source 14, including the thermocouple 90.

Preferably under the operational control of the computer 24, the first and second motor assemblies 30 and 34 begin to move the fixture 10 in their respective two axes of motion. Specifically, the first motor assembly 30 begins to rotate the fixture 10, with a preferred rpm of from about 0.5 to about 2 rpm, depending on the size and material of the spherical workpieces 12 to be surface treated. Simultaneously therewith, the second motor drive assembly 34 begins to rock the fixture 10 about the pivot axis 28 so as to tilt alternately the top or the bottom of the fixture 10, as shown in FIG. 4, into or away from the incoming surface treatment source 14.

With the fixture 10 both spinning and rocking back and forth simultaneously, the therein contained spherical workpieces 12 also rotate and move back and forth, being alternately in front of the ball holes 64, shown in solid line in FIG. 2, or being alternately in the back of the ball holes 64, shown in phantom line in FIG. 2. Preferably, the forward tilt or angle about the pivot axis 28 is about 10° and the backward tilt or angle is about 3°. Consequently, the spherical workpieces 12 spend most of their time in the forward position in their respective ball holes 64, i.e., about 75% to about 80% of the surface treatment time. Typically, one tilt cycle runs for about 100 seconds. Tilt cycles can vary from about 50 seconds to about 300 seconds.

The specific surface treatment time depends, among others, on the size and material of the spherical workpieces 12, the treatment dose, and the particular treatment source employed. The specific depth of the surface treatment is dictated, for the most part, by the energy of the treatment source 14 and the composition and density of the workpiece material.

During the surface treatment process, the treatment source 14 preferably, although not necessarily, is kept at the selected energy level. Also preferably, the treatment source 14 is kept on at the selected energy level during the entire surface treatment process. When surface treating certain sizes and/or materials however, it may be desirable to expose these spherical workpieces 12 to the treatment source 14 only when they are in their forwardly tilted position and shutting off the treatment source 14 when the spherical workpieces 12 find themselves in the back of their holes 64. This is effected by shutting off the linear motor drive assembly 34 when the fixture is tilted forward and while the spherical workpieces 12 are in their forward position 67. By so doing, the spherical workpieces 12 will spend about 90% to about 95% of their treatment time in the forward position.

In order to assure that the spherical workpieces 12 receive a uniform dose of treatment over their respective entire spherical surfaces during their surface treatment, a randomization step is programmed into the computer 24. This randomization step works as follows. At specific intervals, i.e., once every 90 to about 120 seconds, the second linear motor drive assembly 34 is stopped by the computer 24, for about 15 to about 30 seconds, while at the same time the first motor drive assembly 30 continues rotating the fixture 10, preferably at about one r.p.m. This assures that the forward/backward movement of the spherical workpieces 12 does not occur at the same angle of rotation of the first motor drive assembly 30. Thus, synchronization of the two motor drive assemblies 30 and 34, which would cause non-uniform implantation, is prevented.

Figure 5:
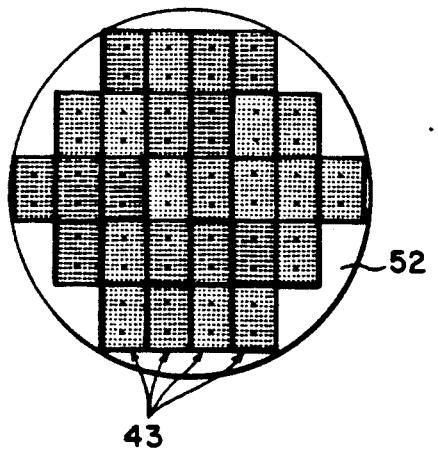
FIG. 5 is a plan view of an alternate fixture designed to present a plurality of miniature spherical workpieces to a treatment source according to the invention.
Figure 6:
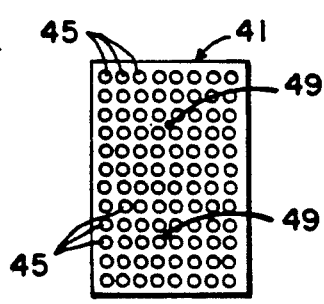
FIG. 6 is a plan view of one operative part of the fixture shown in FIG. 5 but on an enlarged scale.
Figure 7:
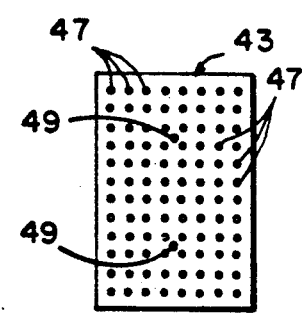
FIG. 7 is a plan view of another operative part of the fixture shown in FIG. 5, also on an enlarged scale.

When surface treating spherical workpieces 12 that are of micro-miniature sizes, i.e., from about 0.032" to about 0.156", a plurality of individual plates 41, each provided with its own individual cover 43, is used in lieu of the disc member 40, note FIGS. 5, 6 and 7. Each of these plurality of plates 41 is provided with a plurality of ball cages 45 to accommodate loosely therein the miniature spherical workpieces. 12. Corresponding and superimposed holes 47 are formed in the respective covers 43, designed both to contain the spherical workpieces 12 within their ball cages 45 and also to expose the workpieces 12 to the treatment source 14. Each plate 41 is machined with ball cages 45 numbering from about 200 to about 2000 per plate 41, depending on their sizes. Each plate 41 can vary in size from about 2"×4" to about 4"×8". The plates 41 and their respective covers 43 are conveniently secured both to each other and to the cooling plate 52 by suitable fasteners 49.

In FIGS. 8-13 are illustrated several treatment sources, each of which can be used in the process of the invention for the surface treatment of spherical surfaces so as to improve their physical and chemical properties.

Figure 8:
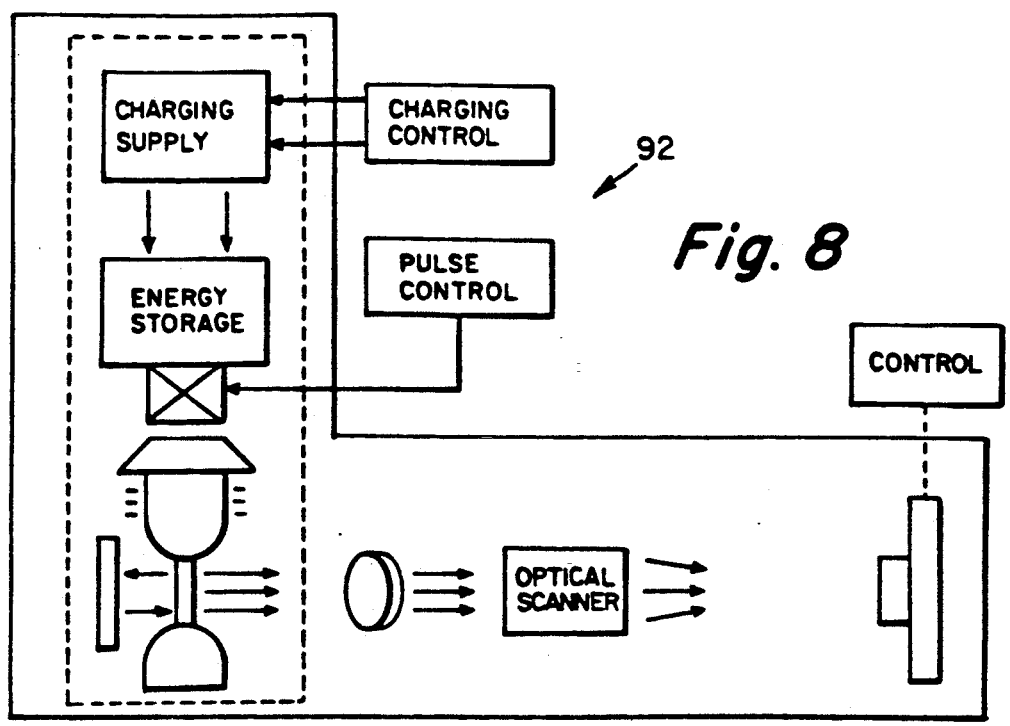
FIG. 8 is a schematic and block diagram of one treatment source according to the invention, which source is a pulsed light source.

In FIG. 8 is illustrated a treatment source 92 which is a pulsed light source. Treatment source 92 is identical to a representative system involving pulse flash lamp processing of metallic and dielectric materials, as more fully disclosed in U.S. Pat. No. 4,229,232, granted Oct. 21, 1980 and assigned to the common assignee herein, Spire Corporation of Bedford, Mass., the disclosure of which is incorporated herein by reference.

When employing a pulsed light source, such as exemplified by the pulsed flash lamp processing of said U.S. Pat. No. 4,229,232, preferably the pulsed light source is operated within the following ranges of light pulse parameters: pulse duration about $10^{-9}$ to about $10^{-1}$ second, photon energy about 0.1 to about 10 ev, and light intensity about $10^{-3}$ to about $10^3$ cal/cm$^2$. The particular light pulse parameters will, of course, depend, inter alia, on the size and material of the spherical workpieces 12, which are formed of one or more of the group including stainless bearing steel, such as 440C, CRB-7 and HAP-40 steel, bearing steel, such as M50, 52100, M-2, and T-15 steel, ceramic, such as silicon nitride, silicon carbide and aluminum oxide, polymers, such as acrylics, titanium alloy, aluminum alloy, and berylium and copper alloys, nickel or cobalt based alloys, tungsten carbide and cobalt alloys, and the like. Other considerations include the depth and character of the surface treatment of the workpieces 12, which are dictated by the end use of the treated workpieces 12.

Figure 9:
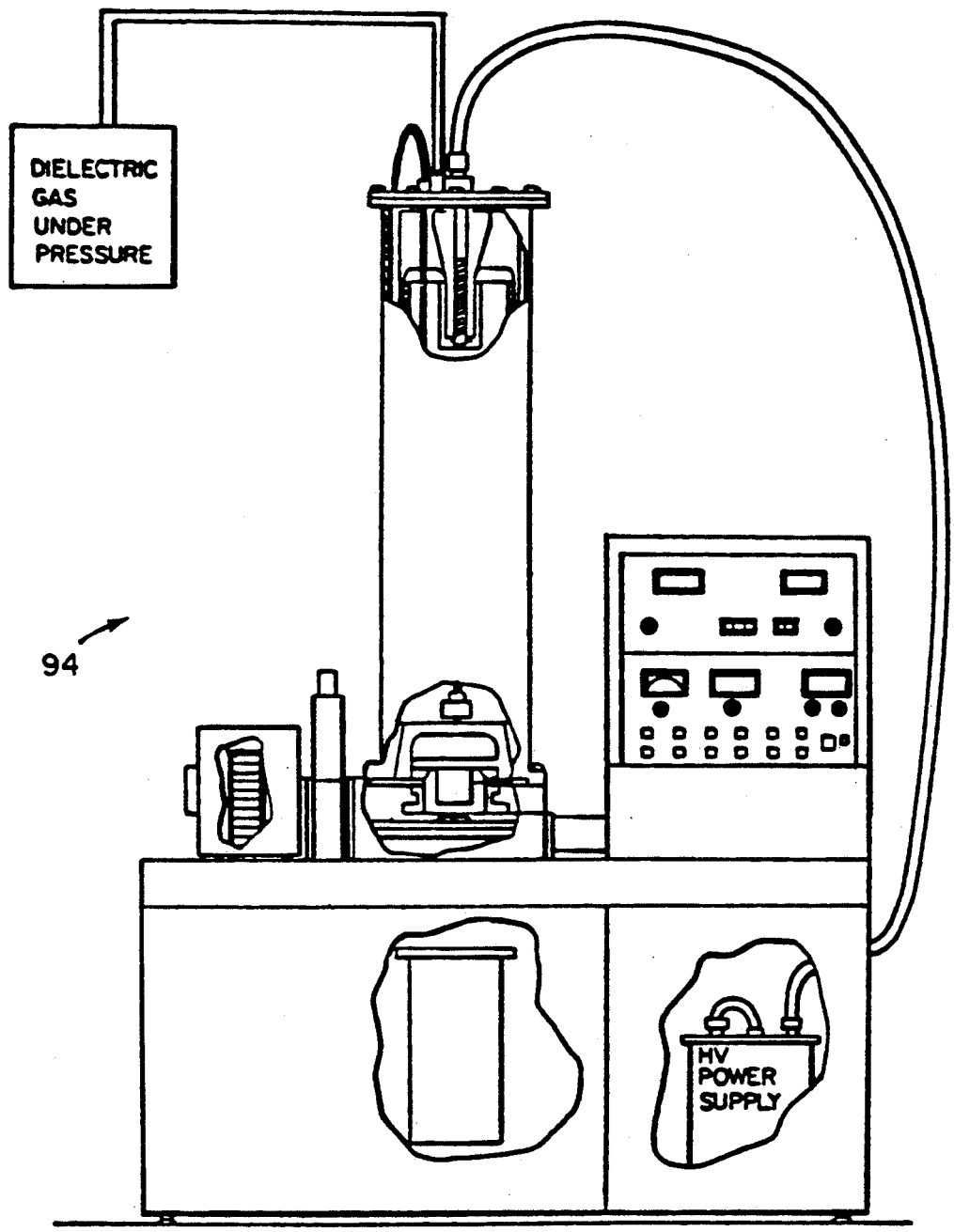
FIG. 9 is a front elevation and block diagram of another treatment source according to the invention, which source is a pulsed electron beam source.

A treatment source 94, illustrated in FIG. 9, is a system designed for the pulsed electron beam processing of semiconductor, dielectric and metallic materials. Treatment source 94 is identical to a representative system involving an electron beam processor, employed therein for localized thermal processing of such an crystalline devices by momentarily elevating the temperature thereof, particularly at their surfaces, as more fully disclosed in U.S. Pat. No. 4,306,272, granted Dec. 15, 1981 to the said common assignee herein, the disclosure of which is incorporated herein by reference.

When employing electron beam processing as disclosed in said U.S. Pat. No. 4,306,272, preferably the pulsed electron beam is operated within the following ranges of electron pulse parameters: pulse duration about $10^{-9}$ to about $10^{-1}$ second, electron energy about $10^3$ to about $10^6$ eV, electron fluence about $10^{-3}$ to about $10^2$ cal/cm$^2$, and beam current from about one to about $10^4$ amp/cm$^2$. The particular electron beam pulse parameters will again depend, inter alia, on the size and material of the spherical workpieces 12. The workpieces 12 herein also are formed of one or more of the group disclosed above re pulsed light sources.

Figure 10:
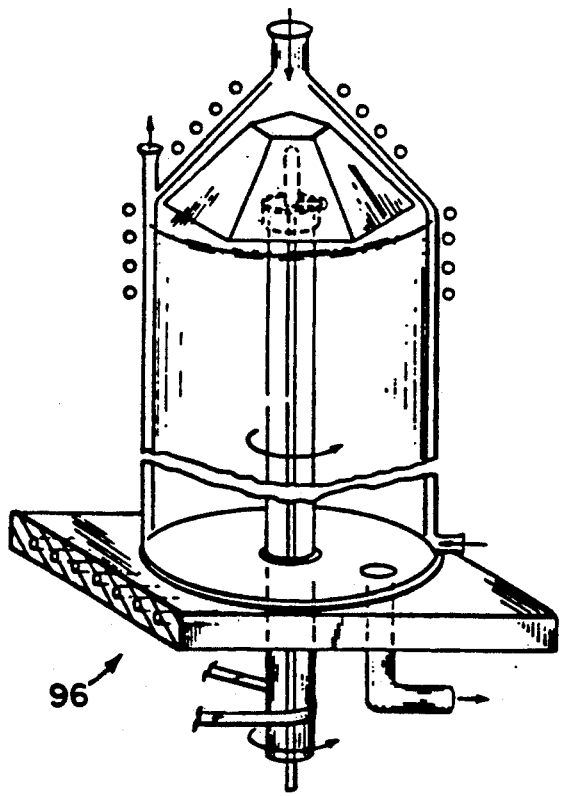
FIG. 10 is a schematic diagram of a further treatment source according to the invention, which source is a reaction chamber for CVD.

In FIG. 10 is illustrated another treatment source 96 for the surface treatment of spherical workpieces 12 according to the invention. Treatment source 96 is identical to a representative reaction chamber employed for chemical vapor deposition (CVD) and/or for metalorganic chemical vapor deposition (MOCVD), as more fully disclosed in U.S. Pat. No. 4,596,208 granted Jun. 24, 1986 and assigned to the said common assignee herein, the disclosure of which is incorporated herein by reference.

When employing a reaction chamber for CVD or MOCVD as the treatment source for the surface treatment of spherical workpieces 12 according to the invention, the workpieces 12 receive a film, preferably a multiconstituent film, on their surfaces, which film is designed securely to adhere to such treated surfaces.

Figure 11:
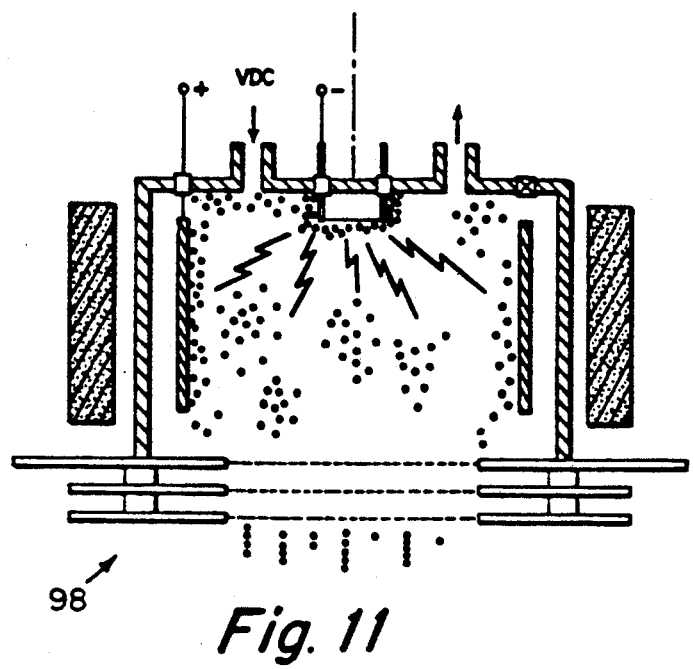
FIG. 11 is a schematic view of still another treatment source according to the invention, which source is a plasma ion deposition apparatus.

FIG. 11 illustrates yet another treatment source 98 for the surface treatment of spherical workpieces 12 according to the invention. Treatment source 98 is the same as a representative plasma source as more fully disclosed in U.S. Pat. No. 4,443,488 granted Apr. 17, 1984 and assigned to the said common assignee herein, the disclosure of which is incorporated herein by reference.

Preferably, the plasma treatment source 98 is a large volume, low pressure, high temperature plasma source, with a preferred temperature of about 25 keV. Plasma treatment source 98 is particularly useful in depositing, inter alia, hard ceramic films on the surface of the spherical workpieces 12 by employing a feed-gas mixture including one or more of the group of: ammonia, nitrogen, oxygen, silane, boron, trifluoride, carbon dioxide and methane.

Figure 12:
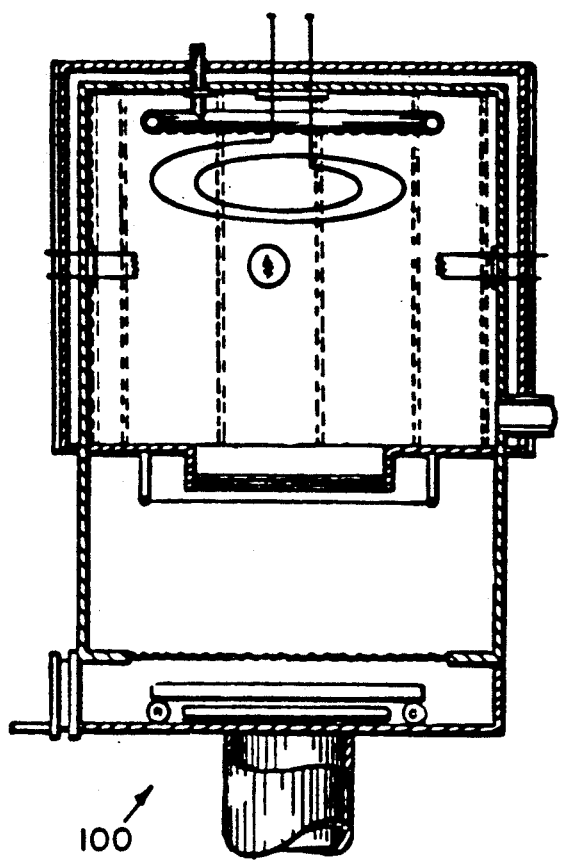
FIG. 12 is a schematic view of still another treatment source according to the invention, which source is an rf excited plasma source.

In FIG. 12 is illustrated still another treatment source 100 for the surface treatment of spherical workpieces 12 according to the invention. Treatment source 100 is the same as a representative plasma source as more fully disclosed in U.S. Pat. No. 4,440,108 granted Apr. 3, 1984 and assigned to the said common assignee herein, the disclosure of which is incorporated herein by references.

Preferably, the plasma treatment source 100 is a radio frequency excited plasma source, employing a feed gas mixture of borazine and benzene vapor designed to coat the spherical workpieces 12 with a thin layer of cubic boron nitride (CBN).

Figure 13:
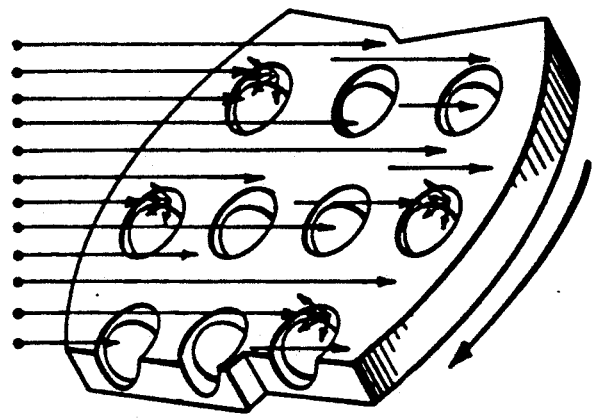
FIG. 13 is an isometric perspective view of yet another means, which means illustrates sputter enhanced ion implantation of spherical workpieces according to the invention.

FIG. 13 illustrates still another treatment source 102 for the surface treatment of spherical workpieces 12 according to the invention. Treatment source 102 illustrates a sputter-enhanced ion implantation process designed to sputter coat spherical workpieces while simultaneously also ion implanting the same, all as more fully disclosed in U.S. Pat. No. 4,855,026 granted Aug. 8, 1989 and also assigned to the said common assignee herein, the disclosure of which is incorporated herein by reference.

Each of the above-described treatment sources 92-102 is intended to effect treatment of the surfaces of the spherical workpieces 12, which treatment covers the entire, total spherical surfaces of each and every one of the workpieces 12 and does so uniformly over their entire respective spherical surfaces. By the term "uniformly" is meant to define a surface treatment which effects treatment to substantially uniform depth and with substantially uniform consistency in resultant physical and chemical makeup of the treated surfaces.

Such treatment of the spherical workpieces 12 which involves the total and uniform coverage of the spherical surfaces is achieved, according to the invention, by the methods of the invention. Specifically, and as noted with reference to FIG. 4, the rotation of the workpiece 10 about its axis is decoupled, i.e., made independent from, the rocking motion (tilting motion) about a second axis either normal or at angle to the rotational axis. As mentioned, the rocking motion is randomly interrupted. Such random interruption of the rocking motion apparently is responsible for the spherical workpieces 12 assuming their various, randomly varied, physical positions within the fixture 10 so as to effect their total and uniform coverage during their respective surface treatments.

It also is within the purview of this invention to employ more than one treatment source during one particular surface treatment run for the spherical workpieces 12. For example, one method of the invention contemplates exposing the spherical workpiece 12 to a physical vapor deposition source in conjunction with an ion beam source designed to coat the workpieces with a layer of coating during high temperature processing effected at low workpiece temperatures. In such a combined exposure, the layer of coating can be formed of a ceramic material while the workpieces 12 themselves are formed of metal. Specifically, the ceramic coating can comprise one of a group including titanium nitride, boron nitride, chromium oxide, aluminum oxide, zirconium oxide, silicon carbide, zirconium nitride, and silicon nitride.

Further, during such combined exposure of the spherical workpieces 12 to both a physical vapor deposition source and an ion beam source, both sources can be operated simultaneously so as to effect concurrent ion bombardment and physical vapor deposition. In the alternative, one source, say the physical vapor deposition source is operated first so as to from a coating on the workpieces 12, followed by exposure to the ion beam source so as to drive some of the atoms of the coating into the surface of the workpieces 12.

It is, furthermore, within the purview of the invention to rock (i.e., oscillate) the fixture 10 about both of the above-mentioned two axes of motion: about the first concentric axis along the drive shaft 32 and the second axis either normal or at an angle thereto and along the drive linkage 36, observe FIG. 4. Both of these motions must be independent from each other, and indeed they are as one is effected by the drive motor 30, while the second is effected by the separate and independent drive motor 34. Further, one or both of these two oscillating motions is again randomly interrupted, as above described, to effect the stated randomization, an important aspect to achieving total and uniform treatment coverage for the spherical workpieces 12.

We have also found that total and uniform surface treatment of the spherical workpieces 12 can be further enhanced by the provision of a member 104 or 106, but not both, on the inside surface of the ball holes 64, observe FIG. 14. Member 104 is a protrusion, preferably semicircular in cross section, and extends into the ball holes 64 at a distance slightly less than the difference in lengths between the diameter 66 of the ball holes 64 and the diameter 68 of the particular spherical workpieces 12. Member 106 preferably also has the same thickness, i.e., it extends into the ball holes 64 essentially to the same extent as member 104. Member 106 extends however about $\frac{1}{8}$ to about $\frac{1}{4}$ along the axial length of the ball holes 64. The precise location of the members 104 and 106 is not critical and can be as illustrated. In the alternative, either the member 104 or the member 106 can be located closer to the front surface 42, if desired. Members 104 and 106 contribute to the randomization of treatment by jostling the spherical workpieces 12 during their movement within the ball holes 64, whether such movement is effected by rotating and rocking the fixture 10 or by oscillating the fixture 10 in the two intersecting planes.

Thus it has been shown and described improved methods for the surface treatment of spherical workpieces 12, which methods satisfy the objects and advantages set forth above.

Since certain changes may be made in the present disclosure without departing from the scope of the present invention, it is intended that all matter described in the foregoing specification or shown in the accompanying drawings, be interpreted in an illustrative and not in a limiting sense.

What is claimed is:

1. A method for the surface treatment of spherical workpieces comprising:
    (a) providing a fixture accommodating and presenting a plurality of spherical workpieces to a treatment source;
    (b) providing a plurality of spherical workpieces and placing them into said fixture;
    (c) exposing each of said plurality of spherical workpieces contained within said fixture to said treatment source for a predetermined time period so as to improve their surface characteristics;
    (d) rotating said fixture about a first axis and also rocking said fixture about a second axis intersecting said first axis while exposing said plurality of spherical workpieces to said treatment source; and (e) randomly interrupting said rocking motion for a predetermined period of time to effect randomization of said surface treatment;

(f) said predetermined period of time in said randomization being about 15 to about 30 seconds once every 90 to about 120 seconds;

(g) said treatment source being a physical vapor deposition source operated simultaneously with an ion beam source to effect concurrent ion bombardment and physical vapor deposition.

2. The method of claim 1 wherein said treatment source is a pulsed electron beam source.

3. The method of claim 2 wherein said plurality of spherical workpieces are formed of one or more of the group including stainless steel, such as 440C, CRB-7 and HAP-40 steel, bearing steel, such as M50, 52100, M-2, and T-15 steel, ceramic, such as silicon nitride, silicon carbide and aluminum oxide, polymers, such as acrylics, titanium alloy, aluminum alloy, and berylium and copper alloys, nickel or cobalt based alloys, tungsten carbide and cobalt alloys, and the like.

4. The method of claim 3 wherein said pulsed electron beam is operated within the following ranges of electron pulse parameters: pulse duration about $10^{-9}$ to about $10^{-1}$ second, electron energy about $10^3$ to about $10^6$ eV, electron fluence about $10^{-3}$ to about $10^2$ cal/cm$^2$, and beam current from about one to about $10^4$ amp/cm$^2$.

5. The method of claim 1 wherein said treatment source is a pulsed light source, such as a pulsed laser or a flash lamp.

6. The method of claim 5 wherein said plurality of spherical workpieces are formed of one or more of the group including stainless steel, such as 440C, CRB-7 and HAP-40 steel, bearing steel, such as M50, 52100, M-2, and T-15 steel, ceramic, such as silicon nitride, silicon carbide and aluminum oxide, polymers such as acrylics, titanium alloy, aluminum alloy, and berylium and copper alloys, nickel or cobalt based alloys, tungsten carbide and cobalt alloys, and the like.

7. The method of claim 6 wherein said pulsed light source is operated within the following ranges of light pulse parameters: pulse duration about $10^{-9}$ to about $10^{-1}$ second, photon energy about 0.1 to about 10 ev, and light intensity about $10^{-3}$ to about $10^3$ cal/cm$^2$.

8. The method of claim 1 wherein said treatment source is a plasma source.

9. The method of claim 8 wherein said plasma source is a large volume, low pressure, high temperature plasma source.

10. The method of claim 9 wherein said plasma source has a temperature of about 25 keV.

11. The method of claim 8 wherein said plasma source is an rf excited plasma source with a feed gas mixture of borazine and benzene vapor designed to coat said spherical workpieces with a thin layer of cubic boron nitride (CBN).

12. The method of claim 1 wherein said treatment source is a reaction chamber for chemical vapor deposition (CVD) or for metalorganic chemical vapor deposition (MOCVD) designed for the deposition of multiconstituent films on said plurality of spherical workpieces, said films being epitaxial, polycrystalline or amorphous.

13. The method of claim 1 wherein said treatment source is a cathode sputtering source designed to deposit a thin layer of metal on said plurality of spherical surfaces.

14. A method for the surface treatment of spherical workpieces comprising:

(a) providing a fixture accommodating and presenting a plurality of spherical workpieces to a treatment source;

(b) providing a plurality of spherical workpieces and placing them into said fixture;

(c) exposing each of said plurality of spherical workpieces contained within said fixture to said treatment source for a predetermined time period so as to improve their surface characteristics;

(d) rotating said fixture about a first axis and also rocking said fixture about a second axis intersecting said first axis while exposing said plurality of spherical workpieces to said treatment source; and (e) randomly interrupting said rocking motion for a predetermined period of time to effect randomization of said surface treatment;

(f) said treatment source being a sputter-enhanced ion implantation source designed to sputter coat said plurality of spherical workpieces while simultaneously therewith designed also to ion implant both said workpieces and said sputter coating being formed thereon.

15. A method for the surface treatment of spherical workpieces comprising:

(a) providing a fixture accommodating and presenting a plurality of spherical workpieces to a treatment source;

(b) providing a plurality of spherical workpieces and placing them into said fixture;

(c) exposing each of said plurality of spherical workpieces contained within said fixture to said treatment source for a predetermined time period so as to improve their surface characteristics;

(d) rotating said fixture about a first axis and also rocking said fixture about a second axis intersecting said first axis while exposing said plurality of spherical workpieces to said treatment source; and (e) randomly interrupting said rocking motion for a predetermined period of time to effect randomization of said surface treatment;

(f) said treatment source comprising a physical vapor deposition source in conjunction with an ion beam source designed to coat said plurality of spherical workpieces with a layer during high temperature processing at low workpiece temperature.

16. The method of claim 15 wherein said layer of coating is formed of a ceramic and said workpieces are formed of metal, and wherein said ceramic is one of a group consisting of titanium nitride, boron nitride, chromium oxide, aluminum oxide, zirconium oxide, silicon carbide, zirconium nitride, silicon carbide, zirconium nitride, and silicon nitride.

17. The method of claim 15 wherein said physical vapor deposition source is operated first to form a coating on said workpieces, followed by exposure to said ion beam source to drive some of the atoms of said coating into the surface of said workpieces.

18. A method for the surface treatment of spherical workpieces comprising:

(a) providing a fixture accommodating and presenting a plurality of spherical workpieces to a treatment source;

(b) providing a plurality of spherical workpieces and placing them into said fixture;

(c) exposing each of said plurality of spherical workpieces contained within said fixture to said treatment source for a predetermined time period so as to improve their surface characteristics; and (d) oscillating said fixture about a first and second axis intersecting with one another while exposing said plurality of spherical workpieces to said treatment source;

(e) said treatment source comprising a physical vapor deposition source in conjunction with an ion beam source;

(f) said phyical vapor deposition source being operated simultaneously with said ion beam source so as to effect concurrent ion bombardment and physical vapor deposition;

(g) one of said oscillating motions being randomly interrupted for a predetermined period of time to effect further randomization of said surface treatment.

19. A method for the surface treatment of spherical workpieces comprising:
(a) providing a fixture having a plurality of ball holes accommodating and presenting a plurality of spherical workpieces to a treatment source;
(b) each of said plurality of ball holes provided with a protruding member on their inside surfaces;
(c) providing a plurality of spherical workpieces and placing them into said ball holes of said fixture;
(d) exposing each of said plurality of spherical workpieces contained within said fixture to said treatment source for a predetermined time period so as to improve their surface characteristics;
(e) rotating said fixture about a first and also rocking said fixture about a second axis intersecting one another while exposing said plurality of spherical workpieces to said treatment source, such that the rotation and rocking motion occur independently of one another; and
(f) randomly interrupting said rocking motion for a predetermined period of time to effect randomization of said surface treatment;
(g) said predetermined period of time in said randomization being about 15 to about 30 seconds once every 90 to about 120 seconds.

20. A method for the surface treatment of spherical workpieces comprising:
(a) providing a fixture having a plurality of ball holes accommodating and presenting a plurality of spherical workpieces to a treatment source;
(b) each of said plurality of ball holes provided with a protruding member on their inside surfaces;
(c) providing a plurality of spherical workpieces and placing them into said ball holes of said fixture;
(d) exposing each of said plurality of spherical workpieces contained within said fixture to said treatment source for a predetermined time period so as to improve their surface characteristics; and
(e) oscillating said fixture about a first and second axes intersecting with one another while exposing said plurality of spherical workpieces to said treatment source;
(f) said protruding member causing random positioning and exposure of said spherical workpieces to said treatment source during said oscillation of said fixture about said first and second intersecting axes;
(g) said treatment source being a cathode sputtering source designed to deposit a thin layer of metal on said plurality of spherical surfaces.

21. The method of claim 20 wherein one of said oscillating motions is randomly interrupted for a predetermined period of time to effect further randomization of said surface treatment, said predetermined period of time in said randomization being about 15 to about 30 seconds once every 90 to about 120 seconds.

* * * * *